United States Patent
Gunda

(10) Patent No.: US 11,556,249 B2
(45) Date of Patent: Jan. 17, 2023

(54) DELAYING RANDOM DATA RELOCATION FOR REDUCING WRITE AMPLIFICATION IN STORAGE DEVICES

(71) Applicant: WESTERN DIGITAL TECHNOLOGIES, INC., San Jose, CA (US)

(72) Inventor: Sridhar Prudvi Raj Gunda, Karnataka (IN)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

(21) Appl. No.: 17/009,487

(22) Filed: Sep. 1, 2020

(65) Prior Publication Data
US 2022/0066648 A1   Mar. 3, 2022

(51) Int. Cl.
*G06F 3/06* (2006.01)
*G11C 16/10* (2006.01)
*G11C 11/56* (2006.01)

(52) U.S. Cl.
CPC .......... *G06F 3/0611* (2013.01); *G06F 3/0644* (2013.01); *G06F 3/0659* (2013.01); *G06F 3/0679* (2013.01); *G11C 11/5628* (2013.01); *G11C 11/5671* (2013.01); *G11C 16/10* (2013.01)

(58) Field of Classification Search
CPC .... G06F 3/0611; G06F 3/0644; G06F 3/0659; G06F 3/0679
See application file for complete search history.

(56) References Cited

U.S. PATENT DOCUMENTS

| | | | |
|---|---|---|---|
| 8,316,176 B1* | 11/2012 | Phan | G06F 12/0246 365/185.33 |
| 9,348,746 B2 | 5/2016 | Sinclair et al. | |
| 9,971,514 B2 | 5/2018 | Sivasankaran et al. | |
| 10,296,452 B2 | 5/2019 | Lee et al. | |
| 2013/0024609 A1* | 1/2013 | Gorobets | G06F 3/0611 711/103 |
| 2018/0293014 A1* | 10/2018 | Ravimohan | G11C 16/10 |
| 2019/0206452 A1* | 7/2019 | Confalonieri | G01K 3/005 |

FOREIGN PATENT DOCUMENTS

CN        106681663 A        5/2017

OTHER PUBLICATIONS

A screen showt showing SUSE Linux—Administration Guide, Appendix A that shows maximum Sizes of File Systems, archived by the wayback machine on Aug. 4, 2019. (Year: 2019).*

* cited by examiner

*Primary Examiner* — William E. Baughman
*Assistant Examiner* — Janice M. Girouard
(74) *Attorney, Agent, or Firm* — ArentFox Schiff LLP

(57) ABSTRACT

Techniques for reducing write amplification in solid state storage are disclosed. A storage device includes single-level cell (SLC) and multi-level cell (MLCs) portions. A controller may allocate for storage in the SLC portions a sequential closed block pool for sequential data and a random closed block pool for random data. Responsive to certain conditions, the controller may relocate the sequential and random data from the respective sequential and random closed block pools to the MLC portions. The sequential data are relocated prior to the random data. Delaying relocation of random data reduces valid count at the relocation time, reducing write amplification and improving random reads.

20 Claims, 12 Drawing Sheets

DELAYING RANDOM DATA RELOCATION FOR REDUCING WRITE AMPLIFICATION IN STORAGE DEVICES

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

Flash memory generally must erase entire data blocks prior to rewriting new host data to locations within the blocks. The stored host data is rewritten to other locations within the storage device commonly more than once, to enable blocks that include a sufficient amount of invalid data to be erased and used again to store new data. Rewriting data requires an already used portion of the memory to be read and written to another new location, the latter of which must also first be erased if it was previously used. For these and other reasons related to the operational characteristics of flash memory, each portion of new host data to be written usually corresponds to multiple portions of the same data that is copied and rewritten to more than one memory location. This state of having the initial amount of written host data become a multiple of the initial amount is referred to as write amplification (WA). WA undesirably increases latency and available storage space, and reduces random read performance due to consumption of additional bandwidth incurred by relocating data.

The present disclosure addresses these and other shortcomings in the art.

SUMMARY

One aspect of a storage device is disclosed herein. The storage device includes a memory and a controller. The memory includes single-level cell (SLC) and multi-level cell (MLC) portions. The controller is configured to allocate a first closed block pool for sequential data and a second closed block pool for random data, to relocate the sequential data in one of the SLC portions from the first closed block to the MLC portions, and to relocate the random data in another one of the SLC portions from the second closed block to the MLC portions. The sequential data is relocated prior to the random data.

Another aspect of a storage device is disclosed herein. The storage device includes a memory including single-level cell (SLC) and multi-level cell (MLC) portions, and a controller configured to write random data to one of the SLC portions in a random data block and to write sequential data to another of the SLC portions in a sequential data block, and to relocate the sequential data in the sequential data block to one of the MLC portions prior to relocating the random data in the random data block to another one of the MLC portions.

A further aspect of a storage device is disclosed herein. The storage device includes a memory including a plurality of first memory locations and a plurality of second memory locations, and a controller. The controller is configured to write random data to one of the first memory locations and sequential data to another of the first memory locations, and upon determining that an amount of valid data in the another of the first memory locations meets a threshold, to relocate the sequential data to one of the plurality of second memory locations prior to relocating the random data.

It is understood that other aspects of the storage device and method will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
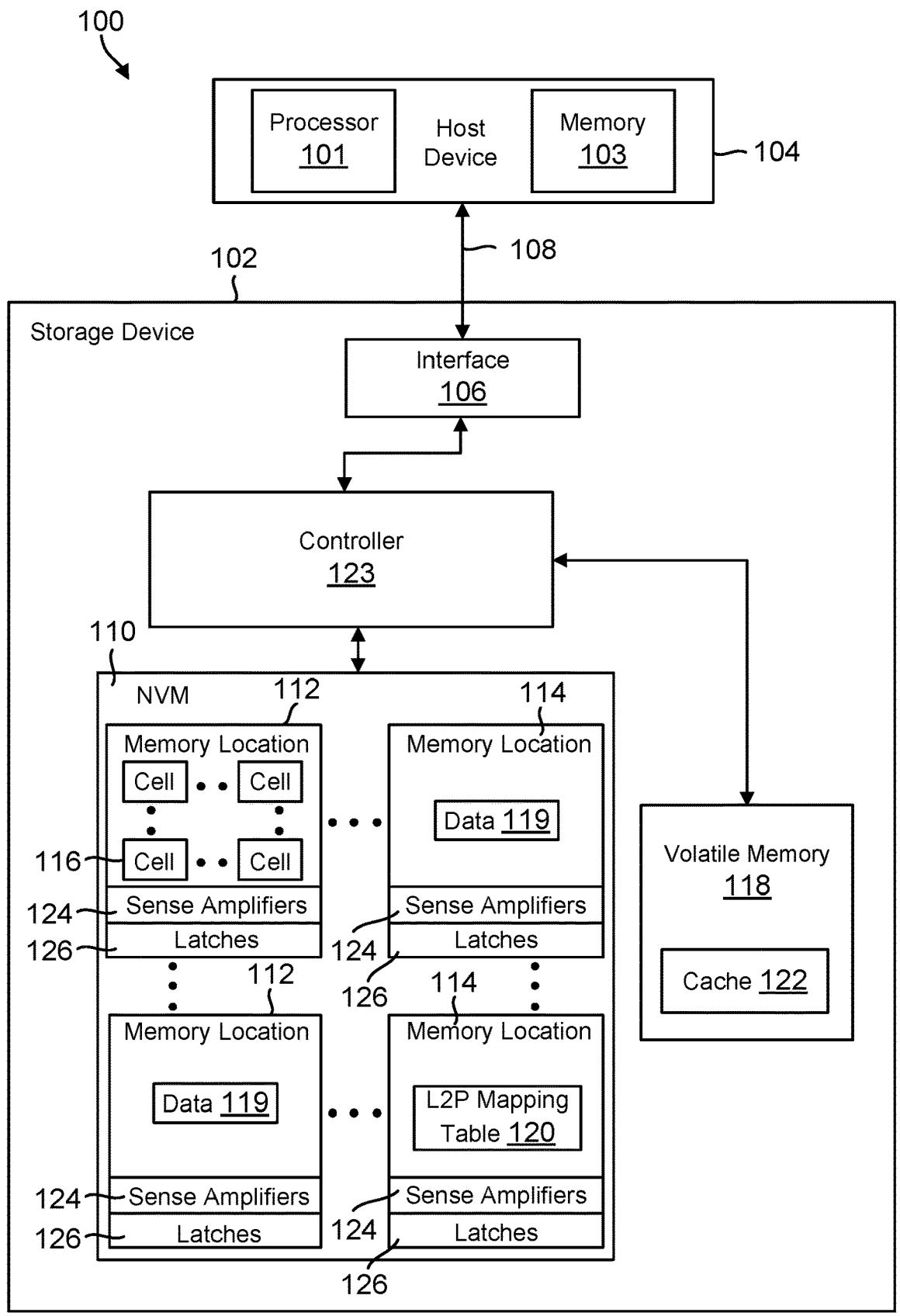
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

The present disclosure is directed to block management techniques in a flash storage device for reducing the relocation of invalid random data from the SLC portions of the storage device to the MLC portions, thereby reducing write amplification (WA) and improving random read performance.

Ideally, in a host write operation to a storage device having a memory and a controller, the controller stores one copy of the written data such that at a given time, there exists a single copy of that data in the memory. WA predicts that in practice, however, more than one copy of the host data in the memory will be present for a single written instance of that data. The amount of WA can be adversely or favorably affected by different procedures used in block handling techniques such as SLC-SLC compaction, garbage collection, folding, wear leveling, and overprovisioning, to name a few.

In a NAND flash memory, for instance, data is logically organized in a two or three dimensional array of blocks. The data is written to a block in smaller flash memory units (FMUs) such that there are multiple FMUs per block. It may subsequently become desirable to re-use some of these blocks for new host programming (i.e., new host writes), such as in cases where a block begins to accumulate a large amount of invalid data (e.g., data marked as outdated or obsolete). However, because the operational characteristics of NAND devices require that a previously-written block first be erased in a single operation prior to being written to again with the new host data, any valid data in that block must, to avoid erasure, first be rewritten to an available memory location in another block. Only after all valid data in that block is rewritten to a different block can the original block be eligible for erasure. The memory locations in the block that still contain copies of the initial data (i.e., that were copied to other blocks) were marked as obsolete or invalid after being rewritten. This enables the controller to track which data is valid, and to update the address table accordingly. The block can be erased in a single operation. The block may then be provided to a pool of free blocks. When the block is used, host writes to FMUs within the block can resume, and the block can be repopulated with new data from the host device.

The internal rewrites in the above example inherently introduce latencies during which there exist at least two copies of the rewritten data—one invalid copy in the original block, and one valid rewritten copy in the new block. These rewrite operations may regularly occur for data throughout the memory, both increasing the overall WA factor and adding further latencies before free blocks can be obtained. WA may also be increased due to other operations, as noted in part above, that involve internal manipulation of the data within the memory, including wear leveling (processes for balancing the writes across the flash cells for maximizing life of the flash device), error detection and correction (correcting errors using ECC and moving data out of bad blocks), read scrubbing (periodic reads from each memory location to correct bit errors), recycling (also called "garbage collection", removing invalid data for making blocks available for use as described in part above), mapping tables update, overlap writes, padding for FMUs, and the like, each of which may cause the WA to increase. Latencies due to these procedures may be especially prevalent in the case of random data, or comparatively smaller amounts of data that may be distributed in various locations across a block. Random data may impede the process of compactly or efficiently storing larger amounts of sequential data in a block. In addition, if the block includes random data, an increased likelihood exists that the data will get invalidated quicker. Each of the obsolete data values contribute to increased WA. In short, high values of WA reduce device performance by introducing additional time delays in block management procedures.

High WA values also reduce random read performance, since host read requests are often stalled due to this consumption of bandwidth. WA can further be increased by conventional block management procedures that fold excessive amounts of invalid data to MLC. That is to say, the problems with random data reads are exacerbated when random data blocks having high amounts of invalid data are quickly relocated from SLC portions to MLC portions. Conventional random data relocation techniques keep WA high and reduce storage efficiency.

The present disclosure introduces aspects of storage devices that reduce WA and increase random read performance. In one aspect of the disclosure, host writes are written to sequential or random data blocks obtained from a single free blocks pool. Full blocks are moved to one of two corresponding random or sequential SLC closed block pools. During folding (relocation) from single-cell blocks to multi-cell blocks (as defined below), sequential blocks are relocated prior to relocating the random data blocks. Different embodiments and variations of the disclosure are possible.

Delaying relocation of random data blocks, among other advantages, allows the sequential closed blocks, which are inherently likely to have a higher valid data count compared to random blocks, to be relocated first. This strategy increases the storage of data in MLC portions that are much more likely to be valid, and does so with much less latency. Further, the delayed random blocks, which remain in circulation for a longer time, are more likely to accumulate valid random data than if the blocks were relocated along with sequential blocks, which further reduces WA. Because higher numbers of relocations of mostly valid data in a faster time reduces the number of operations needed to move data in the memory, the bus is freed for other operations and random read performance is also increased via the various embodiments herein.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for non-volatilely storing data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. For the purposes of this disclosure, a multi-level cell (MLC) is construed to mean any cell storing more than one bit, including two-level cells, triple-level cells, quad-level cells, penta-level cells, etc., and excluding only single-level cells (SLCs). Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
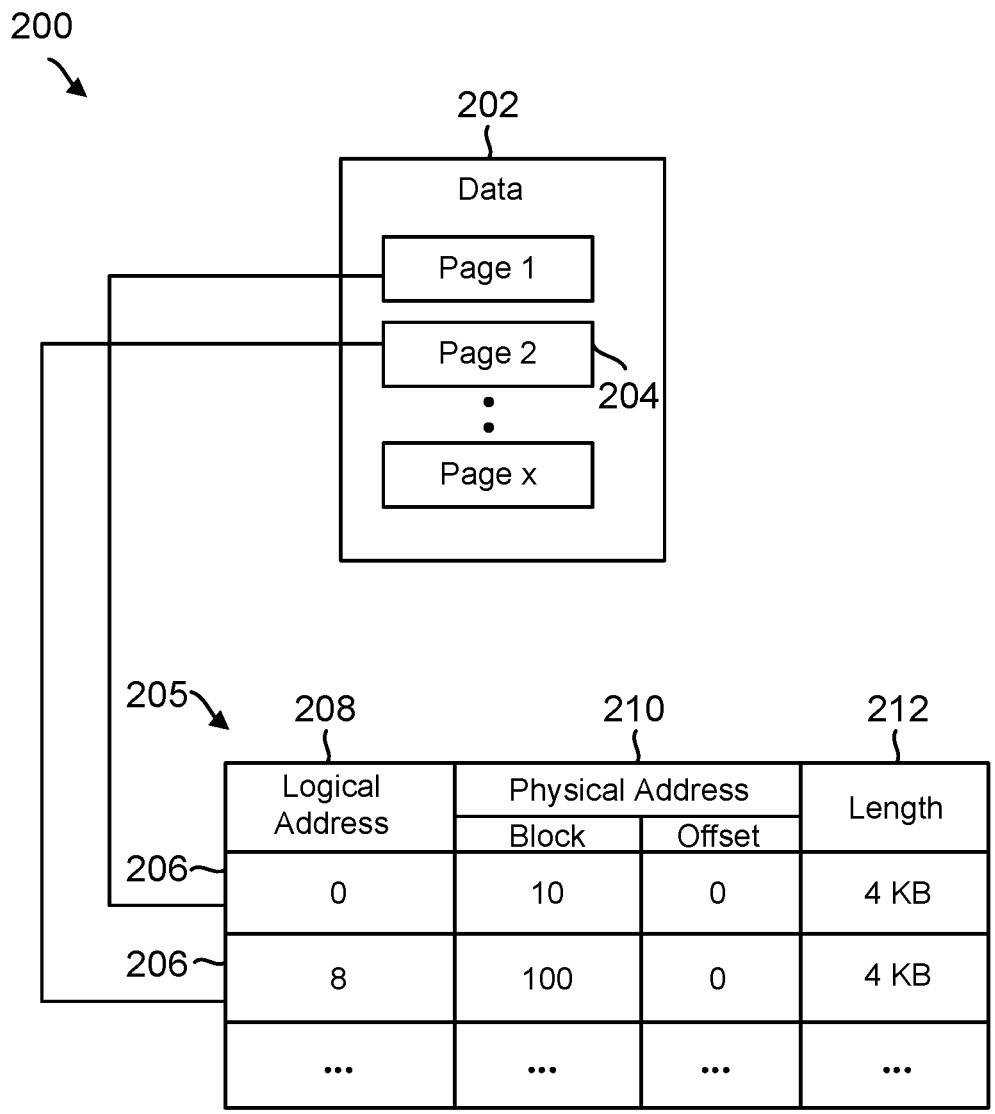
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 512 bytes, 1 kilobyte (KB), or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3A:
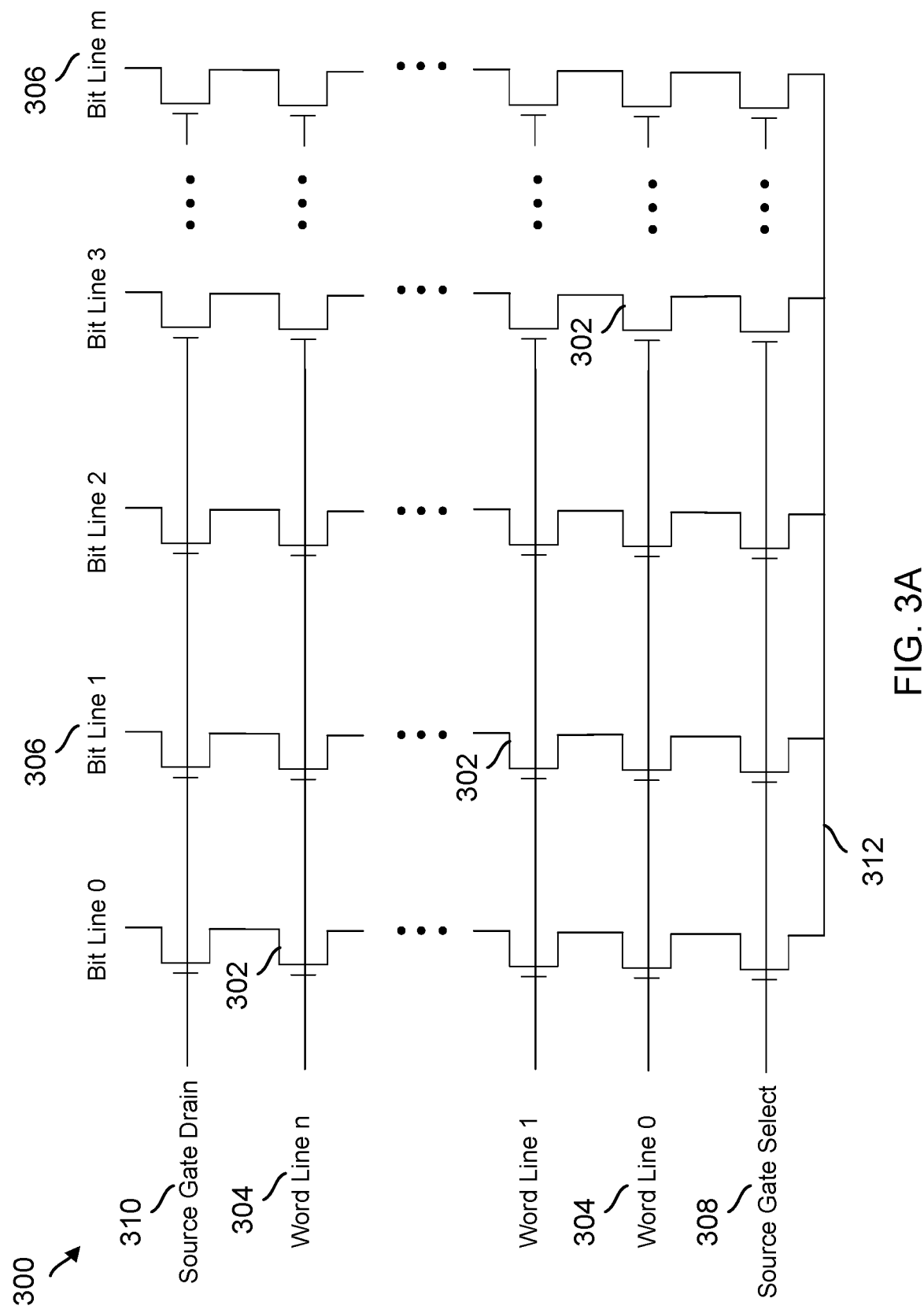
FIG. 3A is a conceptual diagram illustrating an example of a two dimensional array of memory cells in the storage device of FIG. 1.

FIG. 3A illustrates an example of a two-dimensional (2D) NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines spanning across multiple blocks 114 of the NVM 110, where n and m are predefined according to the size of the memory array 300. Source gate select (SGS) cells 308 and source gate drain (SGD) cells 310 are coupled to the memory cells 302 on each bit line 306. The SGS cells 308 and SGD cells 310 connect the memory cells 302 to a source line 312 (e.g. ground) and bit lines 306, respectively.

Figure 3B:
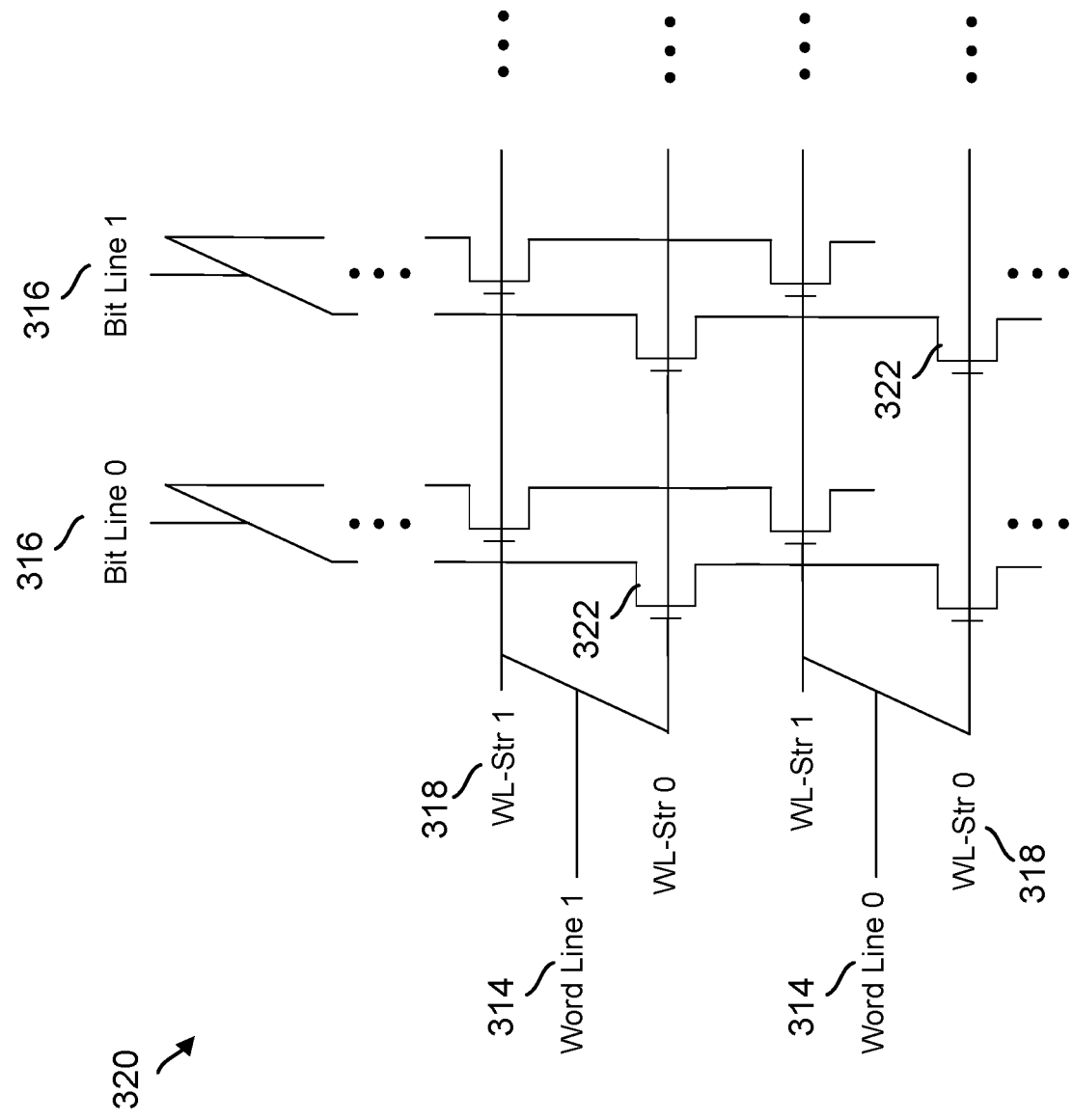
FIG. 3B is a conceptual diagram illustrating an example of a three dimensional array of memory cells in the storage device of FIG. 1.

FIG. 3B illustrates an example of a three-dimensional (3D) NAND memory array 320 of cells 322. Cells 322 may correspond to cells 116 in the NVM 110 of FIG. 1. As in the 2D memory array 300 of FIG. 3A, multiple cells 322 may be coupled to word lines 314 and bit lines 316. However, in the 3D memory array 320, the word lines 314 may each include multiple word line strings 318, and the bit lines 316 may be connected to each of the word line strings 318. Similarly, SGS cells and SGD cells (not shown) may respectively connect the memory cells in each word line string 318 to the source line (not shown) and bit lines 316. Thus, 3D memory array 420 may store more individually accessible pages of data on each word line 314 (e.g. in word line strings 318) than 2D memory array 300. While the 3D memory array 320 illustrated in FIG. 4 includes an example of two word line strings 318 for each word line 314, the word lines 314 may include other numbers of word line strings (e.g. four WL-Strs 0-3) in other examples. The architecture of FIG. 3B, or variations thereof, may be used in 3D NAND implementations including Bit Cost Scalable (BiCS) flash memory for ultra-high density storage devices.

Figure 4:
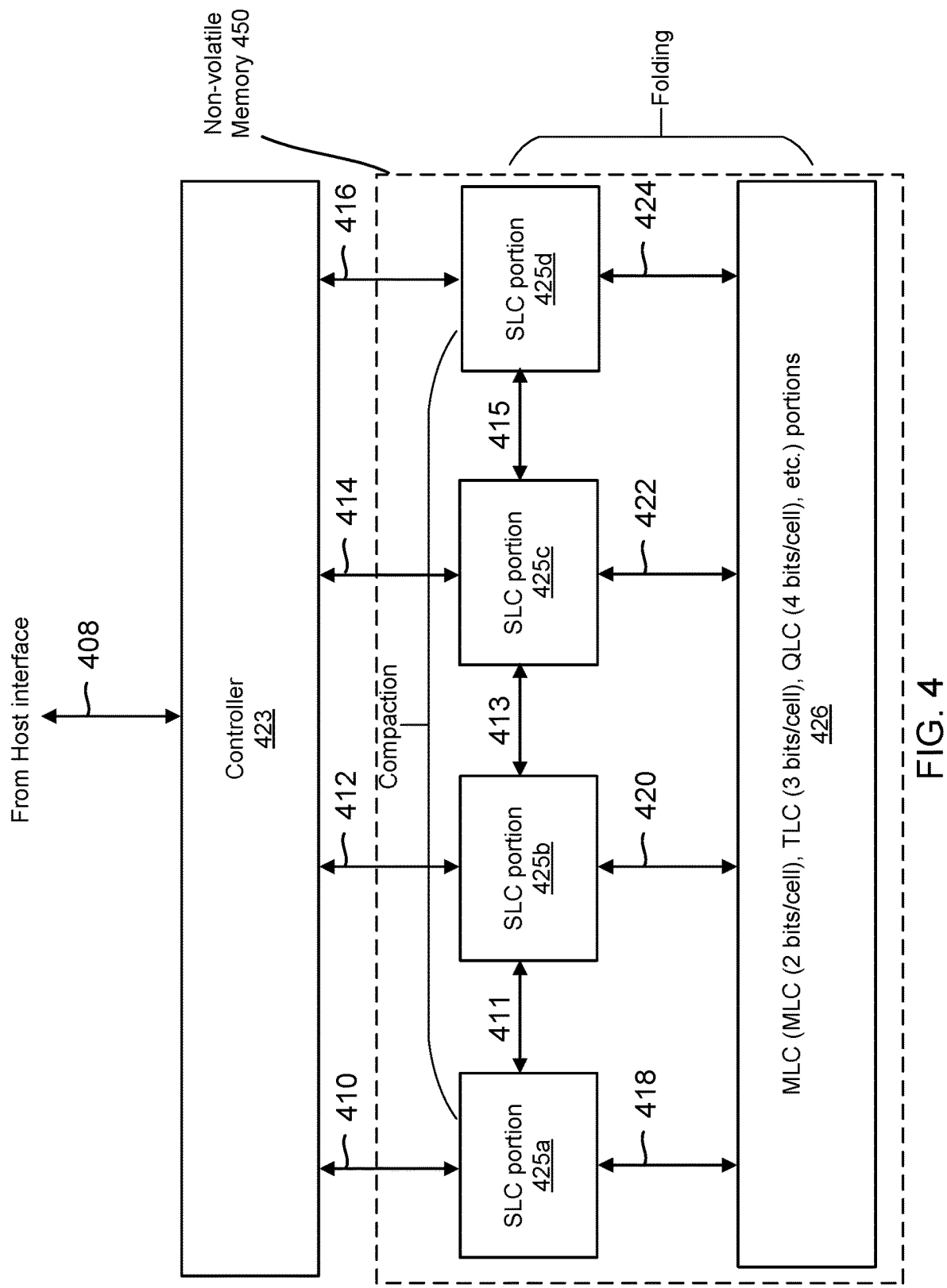
FIG. 4 is a conceptual diagram illustrating folding and compaction in a storage device.

FIG. 4 is a conceptual diagram illustrating basic examples of folding and SLC-SLC compaction in a storage device. FIG. 4 includes a controller 423 that may receive host writes over a bus 408 from a host interface component, and a non-volatile memory 450 containing both SLC and MLC memory portions and data lines coupled to the portion for sending and receiving data during various programming, erasing and reading procedures. For purposes of this example, the data lines are simplified logical constructs and in practice, they actual data busses may be arranged in different ways to accomplish the goals herein. Controller 423 may be coupled to various data lines 410, 412, 414 and 416 to respective single-level cell (SLC) portions 425a-d. SLC portions 425a-d may be coupled to each other via data lines 411, 413 and 415. SLC portions can also be coupled via respective data lines 418, 420, 422 and 424 to multi-level cell (MLC) portions 426. It is noted that multi-level cell (MLC) memory architectures have traditionally been ambiguously used to describe both memory cells with two bits, and memory cells with more than one bit. For the purposes of this disclosure the latter interpretation is generally adopted, in which case MLC cells can include cells configured to store any number of bits greater than one (including two). However, where appropriate in the context (e.g., listing different types of SLC, MLC, TLC, QLC cells, etc.), MLC cells in that limited case can refer to two bits/cell.

SLC portions 425a-d may be considered logical memory locations for purposes of this example, and as such are not necessarily limited to any particular memory cell, page, or block configuration. For example, SLC portion 425 may be considered one logical group of memory locations that, while separate from SLC portions 425b-d, can be arranged in different ways. Similarly, MLC portion 426 need not be physically restricted to particular cells, blocks or pages, but they may be considered for purposes of this illustration as one logical set of memory locations. Also, as noted above, data lines 410-415 and 418, 420 422, and 424 may be considered logical connections that may be physical busses or wires for the traversal of data to and from different regions for the purpose of demonstrating the concepts of FIG. 4, but the data lines are primarily for purposes of illustration here and do not restrict the scope of the disclosure to the configuration shown, nor do they exclude the possibility that other or different data lines or busses are present, for example.

The SLC portions 425a-d use one bit per cell as heretofore described, and for this reason they are typically faster and more reliable than MLC portions 426, the latter of which uses more than one bit per cell. Thus, while slower in writes and erases, the MLC portions 426 may have much higher memory capacity than the SLC portions 425a-d. SLCs generally have a longer life than MLCs as well, although the former's cost is also greater. In sum, because both the MLC portions and the SLC portions have different benefits (and limitations) that often complement one another, making it often advantageous to combine these technologies into a single storage device. For example, to achieve a most beneficial result, the SLC portions may be used for new data or frequently-used short term data, while the MLC portions may be reserved for longer term storage of data involving less expected use in the near term.

SLC and MLC portions may be combined to maximum benefit using compaction and folding. SLC-SLC compaction reclaims memory by targeting blocks that have enough stale data to justify their erasure, and by compactly rewriting data from the targeted blocks as described above to new blocks. In turn, the prior copies of the data are marked "stale" or "obsolete", and the L2P mapping table is updated to associate the new LBA with the PBA of the compacted data. Referring to FIG. 4, after the controller performs a number of host writes over time to the SLC portions 425a-d over respective lines 410, 412, 414, and 416, the SLC portions 425a-d can compactify the data, in this example using lines 411, 413 and 415 as necessary. SLC-SLC compaction or relocation as well as SLC-MCL data relocation increases WA. Accordingly, an object of the disclosure as described below is to ensure that less invalid data is moved to or stored in the MLC portions.

Folding is the process of transporting blocks of data that include valid data to the MLC cells for storage, which is typically intended for a longer period of time. Once folding occurs for a block, e.g., a block in SLC 425b, the block's data is transferred over data line 420 to the MLC portion 426. The block having the data that was transferred via folding can then be erased, which in turn reduces WA and, eventually after any additional stale values of the data are erased, the WA for that data can return to a value closer to one (1).

By focusing on the behavior of random data, the present disclosure provides techniques for performing these activities in a manner that reduces the WA factor over the techniques currently in use. WA can be more simply defined as the ratio of the total instances of data written to the storage device at a given time to the instance of the (same) data written to the storage device by the host. A number of factors influence WA, and a more precise definition may be, for example:

> WA=(host data+data from mapping tables across FE,FTL,NAND interface+relocated data+read scrubbed data+read recovery data)÷(host data).

Other factors may influence WA, and certain factors in the formula described above may be more or less significant than others in the overall computation of WA. Various implementations may place some distinctions on the treatment of sequential and random data. In general, the key to distinguishing sequential and random data is the continuous nature (or absence thereof) of the logical block addresses (LBAs) over a plurality of commands. For example, in an embodiment, if data associated with continuous LBAs is transmitted across three or more host write commands, the data is considered to be sequential data. Otherwise, in the absence of LBA continuity, the data is considered random data. Random data is data other than sequential data. Thus, random data may be associated with small isolated data segments sent over one or a few LBAs, as part of a single host write, for example.

Figure 5:
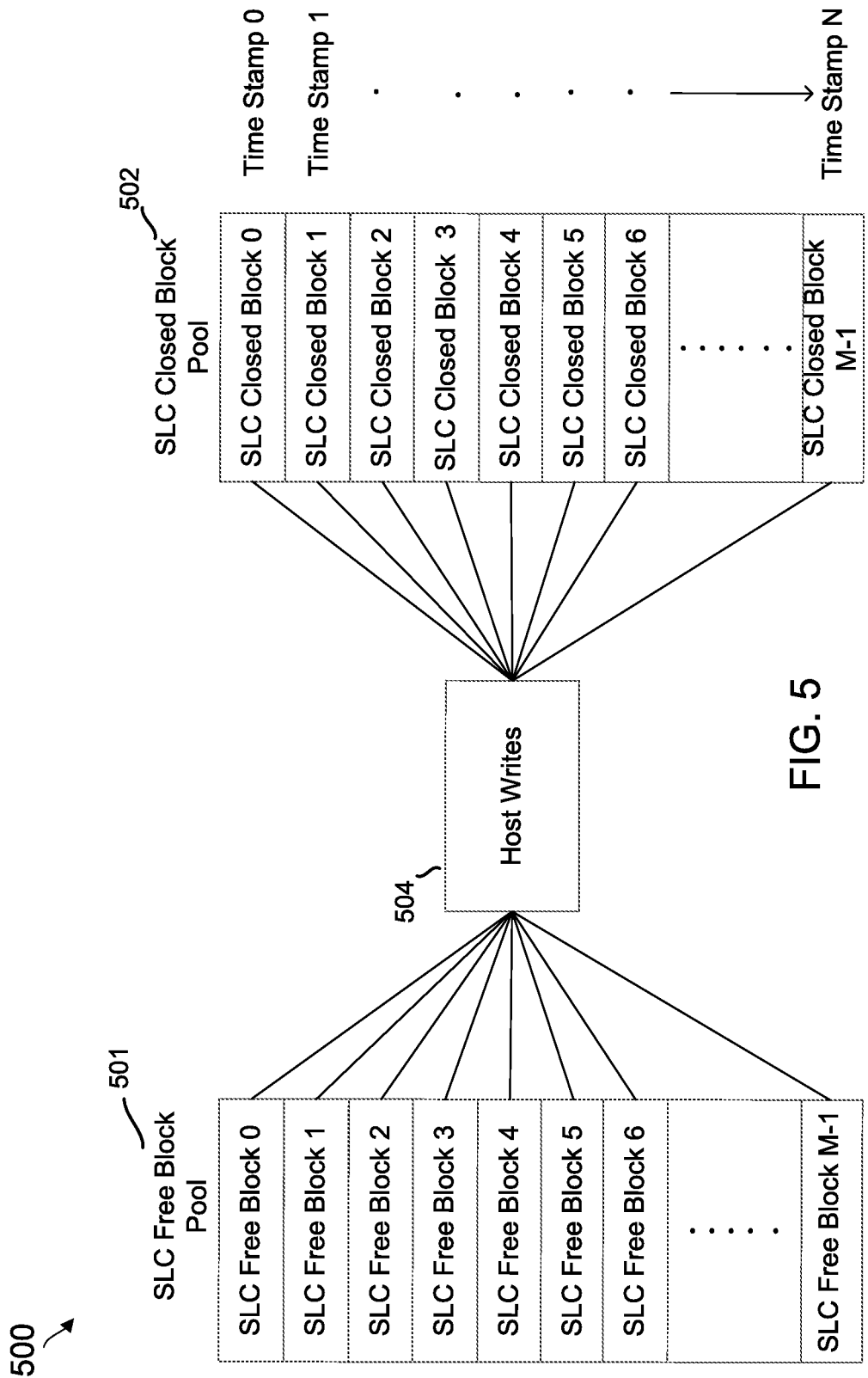
FIG. 5 is a conceptual diagram illustrating a write flow for closing full blocks of sequential or random data and moving the full blocks to a single closed block pool.

FIG. 5 is a conceptual diagram 500 illustrating a conventional write flow for closing full blocks of sequential or random data and moving the full blocks to a single closed block pool. Conventional host write implementations organize writing to SLC blocks in a memory array into an SLC free block pool 501 and an SLC closed block pool 502. As an exemplary configuration, sequential and random data may be written to different SLC blocks such that, after being allocated from the free pool, certain blocks may be arbitrarily populated via initial host writes with random data, and other blocks populated with sequential data. After random or sequential data is written to a block, however, the block continues to receive writes of either random only data, or sequential only data.

In FIG. 5, an initial free pool 501 of M blocks has been allocated for host writes, where M is the total number of allocated free blocks after taking into account the capacity of the SLC portions plus other factors affecting block availability for host writes, such as overprovisioning, for example. Allocated SLC Free Blocks 0→(M−1) may receive writes from the host as represented by 504. Host writes may be repeated to a given block as long as the block remains free. The host writes block 504 thus can represent a plurality of host writes per SLC block. After the block is full, it may be physically closed and thereafter moved to an SLC closed blocks pool 502, with a time of arrival of the SLC closed block marked as one of time stamps 0-N. Once the full SLC block is closed in the conventional implementation of FIG. 5, the block is moved to the SLC closed block pool 502 irrespective of whether the data in the block is random data or sequential data.

Figure 6:
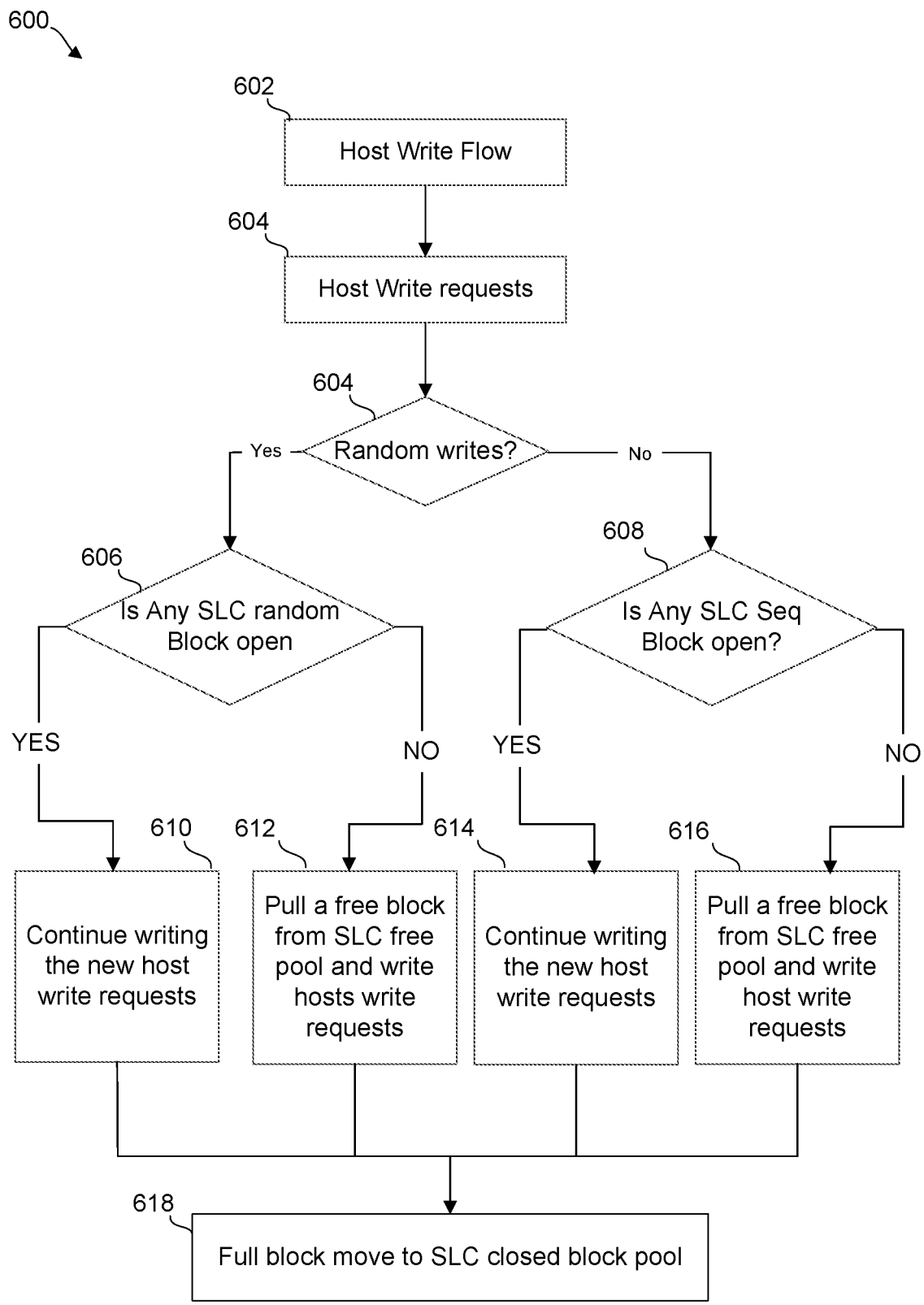
FIG. 6. is a flow diagram illustrating a method for writing sequential and random data to different blocks and moving full blocks to an SLC closed block pool.

FIG. 6. is a flow diagram 600 illustrating a conventional method for writing sequential and random data to different blocks and moving full blocks to a closed block pool. The host write flow logically begins at 602, after which a write request is received by the controller of the storage device from the host at 604. If the block is not a random write (604), then it is a sequential write and the controller determines whether any SLC sequential blocks in use are open—that is, not full (608). If one is open, the host continues writing the sequential data to the open sequential block, as in 614. Otherwise, if no open blocks are available, the block pulls a free block from the SLC free pool and writes the sequential data corresponding to the host write request (616).

If the host write request corresponds to random data (604), the controller instead determines whether any SLC random block is still open (606). If an SLC block that includes random data is open, the controller writes the host data corresponding to the new host write to the open SLC random block (610). Otherwise, the controller pulls a free block from the SLC free pool and begins writing the random data into that available block, as in 612. During all of these events, the corresponding L2P table is updated to include reference to the latest valid copy of the data.

If at the conclusion of any of 610, 612, 614 or 616, the block is filled, the full block is moved to the SLC closed block pool as in 618, regardless of whether the block includes random or sequential data.

The conventional implementation of relocation of closed blocks as described above with reference to FIG. 6 is performed based on a least recently closed (LRC) algorithm. More specifically, the block in the pool that has been closed the longest is the block that is chosen for relocation. In addition, the current implementation relies on blindfolded relocation of the data to the MLC block, which means that the amount of invalid data that may be in the block is not taken into account in moving the block, provided at least there is any valid data in the block. One shortcoming of the LRC approach is that may adversely affects wear leveling objectives. Wear leveling attempts to use certain blocks, pages and cells evenly over a given time period to help ensure that all memory locations are used with approximately the same degree of frequency to avoid causing certain cells to degrade into non-operation more quickly than others. The block that has been closed the longest does not necessarily correspond to the block for which wear leveling is required, rendering the two operations potentially at odds with one another.

Another problem of the conventional implementation relates to the blindfolded relocation technique. As noted, this operation performs data relocation of closed blocks that have valid data to MLC portions irrespective of the amount of valid data in the block. Since random data blocks are inherently more likely to include invalid data, the blindfolding technique can unnecessarily move blocks to MLC portions that have more invalid data than other blocks (such as sequential blocks). The MLC portions in the memory become occupied with blocks with less valid data overall and instead, have more copies of obsolete data. This increases WA. Read performance of random data stored in this fashion is similarly degraded since random data is more likely to be found in the slower MLC portions, increasing the number of overall operations. Also, the increased bandwidth utilized in moving these MLC data blocks to MLC data adversely affects random read performance.

Figure 7:
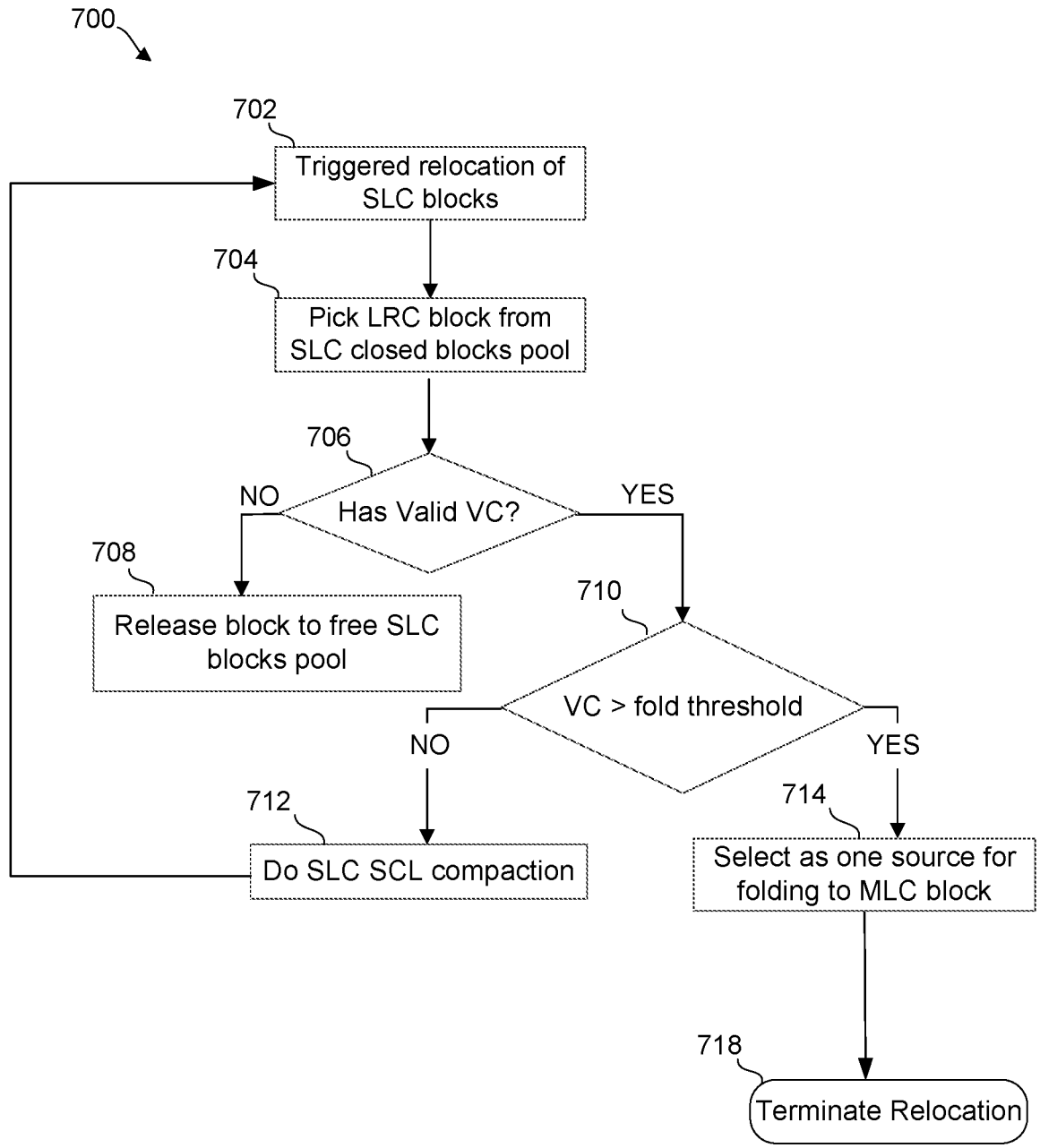
FIG. 7 is a flow diagram illustrating a method for triggered relocation of SLC blocks.

FIG. 7 is a flow diagram 700 illustrating a conventional method for a triggered relocation of SLC blocks. When the relocation of the SLC blocks is triggered (e.g., all blocks are closed and moved to the SLC closed blocks pool, see FIG. 6, 618) at 702, the controller selects a block from the SLC closed blocks pool using LRC. Next, the controller determines whether the selected block has a valid VC or valid count (706). A positive VC means the block includes valid data. If the block does not have a valid VC, the block is released to the free SLC blocks pool (708) where it can be used to include valid data via subsequent SLC-SLC compaction, garbage collection, further host writes, etc. If the block includes valid data (706), the controller next determines whether the VC>fold threshold (710). The fold threshold is a value used for determining whether a block storing valid data has enough data to require folding the data (i.e., relocating the data to MLC). The threshold may be set by a user or by the system based upon an optimization algorithm. If the fold threshold is not met, the SLC block is not folded and instead, the controller makes the block available for additional SLC-SLC compaction (step 712) to free up space for valid data as described in more detail above. If, however, VC for the block meets or exceeds the threshold, depending on the implementation, the controller selects the data in the SLC block as a source for folding to the MLC block (step 714). Thereupon, the relocation procedure for the block at issue terminates (step 718).

Shortcomings of the present approach with reference to the relocation of blocks without regard to their data type have been discussed above, as well as the problems associated with blindfolded moving of data in SLC blocks to MLC blocks. The blocks including random data are often stored in the closed block pool and subsequently folded to MLC portions despite having much less valid data than other sequential blocks.

Figure 8:
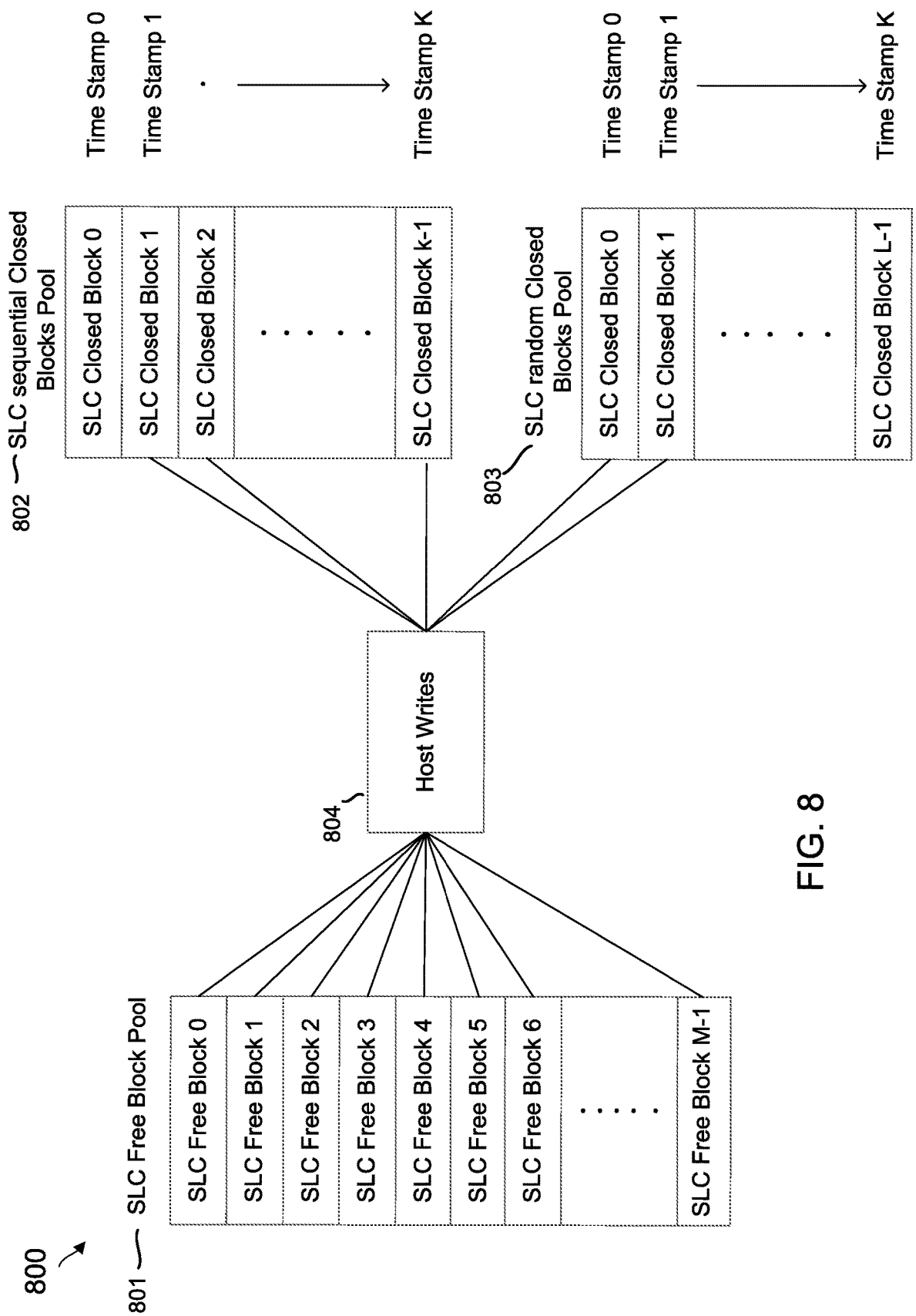
FIG. 8 is a conceptual diagram illustrating a write flow for closing full blocks of sequential or random data and moving the blocks to separate closed block pools.

In accordance with aspects discussed herein, FIG. 8 is a conceptual diagram 800 illustrating a write flow for closing full blocks of sequential or random data and moving the blocks to separate closed block pools. As before, a single SLC free block pool 801 includes all of the blocks that may be used during the programming process as the host fills the storage device with data. During an initial host write 804, a group of blocks 0→(M−1), say Block 0, is selected in the free blocks pool 801. If the data is random data, the controller will perform a host write of the random data to the block 0 and for the rest of the process, block 0 will be used only for random data. The same is true if the data were sequential data. As time passes and the amount of host writes progresses, one of the blocks (e.g., block 0) may be filled. Here, unlike the conventional technique, two SLC closed block pools are maintained—one for the full sequential blocks 802 and the other for the full random blocks 803. The ongoing process will cause the free blocks 0 through (M−1) to eventually close and be moved to the SLC sequential closed block pool 802 (storing 0 to (K−1) blocks or the SLC random closed block pool 803 (storing 0 to (L−1) blocks), where the sum of K and L equals M. A time stamp 0→K is also maintained for each block of the sequential and random closed blocks pools 802, 803 to maintain information regarding the relative time a given block was moved to one of the pools 802 or 803.

Having separate closed block pools for random and sequential data enables the controller to select sequential data for relocation while delaying relocation of random data. The random data is then relocated, but only after all of the sequential data has been moved to the MLC. Among other benefits, this aspect of the disclosure takes advantage of the fact that there will generally be a higher valid data count in sequential blocks compared with that of the random data blocks. Thus blocks with a higher VC count are moved to the MLC blocks. It also prevents unnecessarily moving data with high counts of invalid data to the MLC such as the random blocks, which reduces WA. In addition, maintaining data in the SLC pool for a longer time improves random read performance, as the random data in the delayed blocks is more likely to be found in the faster and more accessible SLC, which in turn reduces read latency. In addition, since the random data in the SLC blocks are maintained for a longer period of time in SLC, the amount of valid data in these blocks is likely to decrease due to periodic host writes of additional random data.

While the disclosed embodiments can be applicable to a wide variety of contexts, they may be very helpful in low cost SSDs that do not support direct MLC writes.

Figure 9:
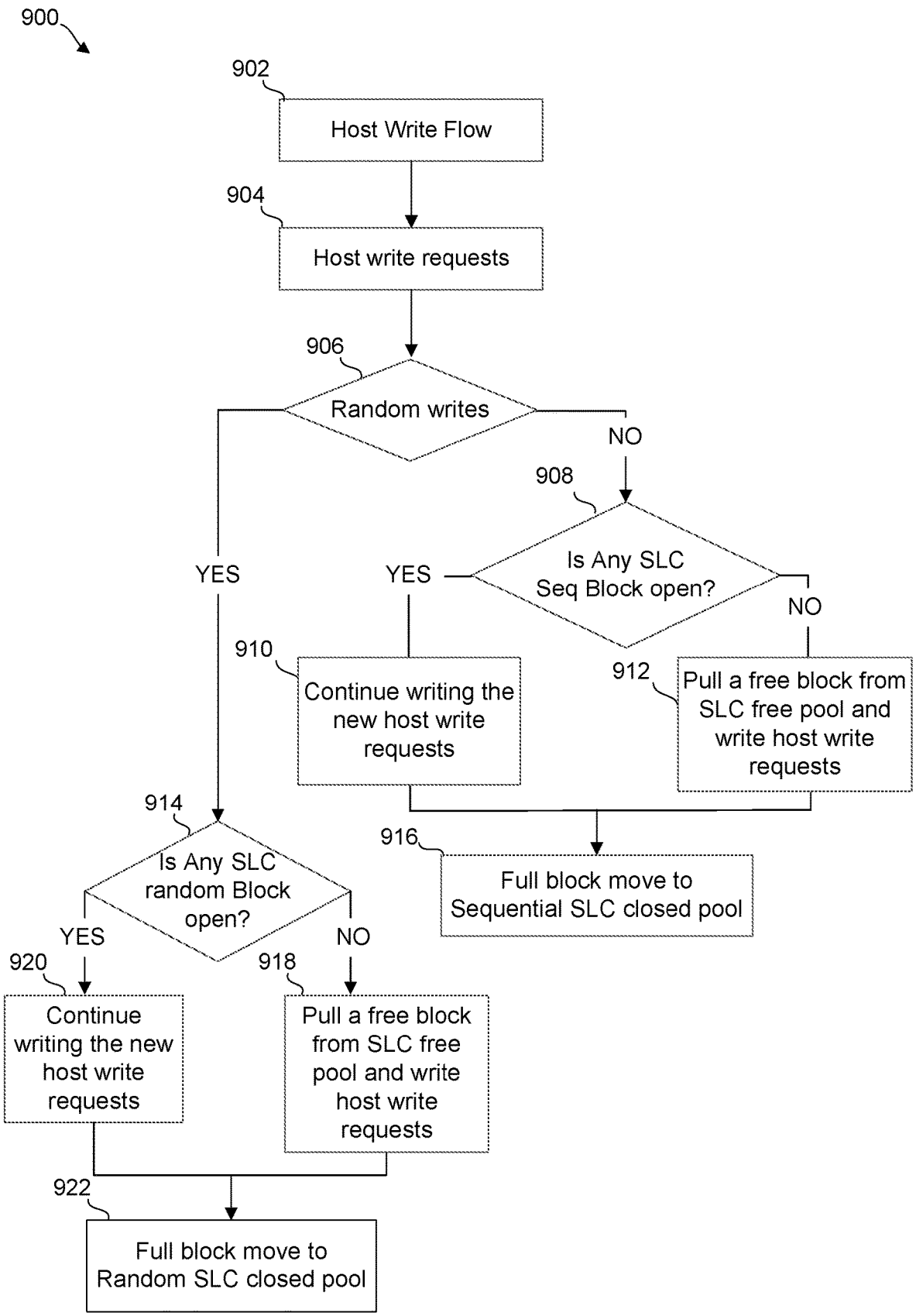
FIG. 9 is a flow diagram illustrating a host write flow for sequential and random writes.

FIG. 9 is a flow diagram 900 illustrating a host write flow 902 for sequential and random writes. The controller determines whether the host write is a random write or part of a sequential write (904). Generally, received data corresponding to a some specified number of consecutive sectors included within two or more host write instructions is sequential data. Conversely, received data corresponding to a value from one sector up to a maximum number of sectors that can concurrently be received in a single host write instruction is random data. Host data is generally considered to be random based on the presence of certain criteria: (1) The length of the continuous data (i.e., data associated with continuous LBAs) is small or less than some specified threshold, or (2) if three or more consecutive write commands from the host are not on a range of continuous LBAs.

Thus, in some embodiments, sequential data may vary based on a threshold determined for the application. As in the example above, sequential data may be data corresponding to a collection of LBAs that is consecutive (continuous) for three or more host write instructions. However, in other embodiments, this criteria may vary.

The above illustrations are exemplary in nature only, and different values of random and sequential data may be appropriate depending on the application and architecture of the system. Other considerations may dictate different values of random versus sequential data.

Referring back to FIG. 9, if the controller determines that the write is random data (906), the controller may determine if an open (not full) random block is available (914). If so, the controller will proceed to write the random data pursuant to the host write request to the identified open random block (920), Otherwise, the controller will pull a free block from the SLC free pool and write the random data per the host write request to that block (918). It will be understood that a free (erased) block can receive either random or sequential data in the SLC portions, but after receiving one or the other, the block will continues to receive the same data type. This means that absent unusual circumstances, the block after the first write becomes a random or sequential block.

At 922, if the write renders the block full, the controller closes the block to further data writes. The block may then be moved to the random SLC closed pool.

Referring back to 906, if the write is sequential (i.e., not random), the controller then seeks an open sequential block (908). If one is found, the controller continues writing to the data from the new host write request to the open sequential block (910). Otherwise, the controller pulls a free block from the SLC free pool and writes the sequential data to the free block (912). If the block is filled with sequential data, the controller closes the block from further writes and moves the block to the sequential SLC closed pool (916). This host write process continues until no free blocks are left and all blocks have been closed and moved to the sequential or random SLC closed pools, as the case may be.

Figure 10:
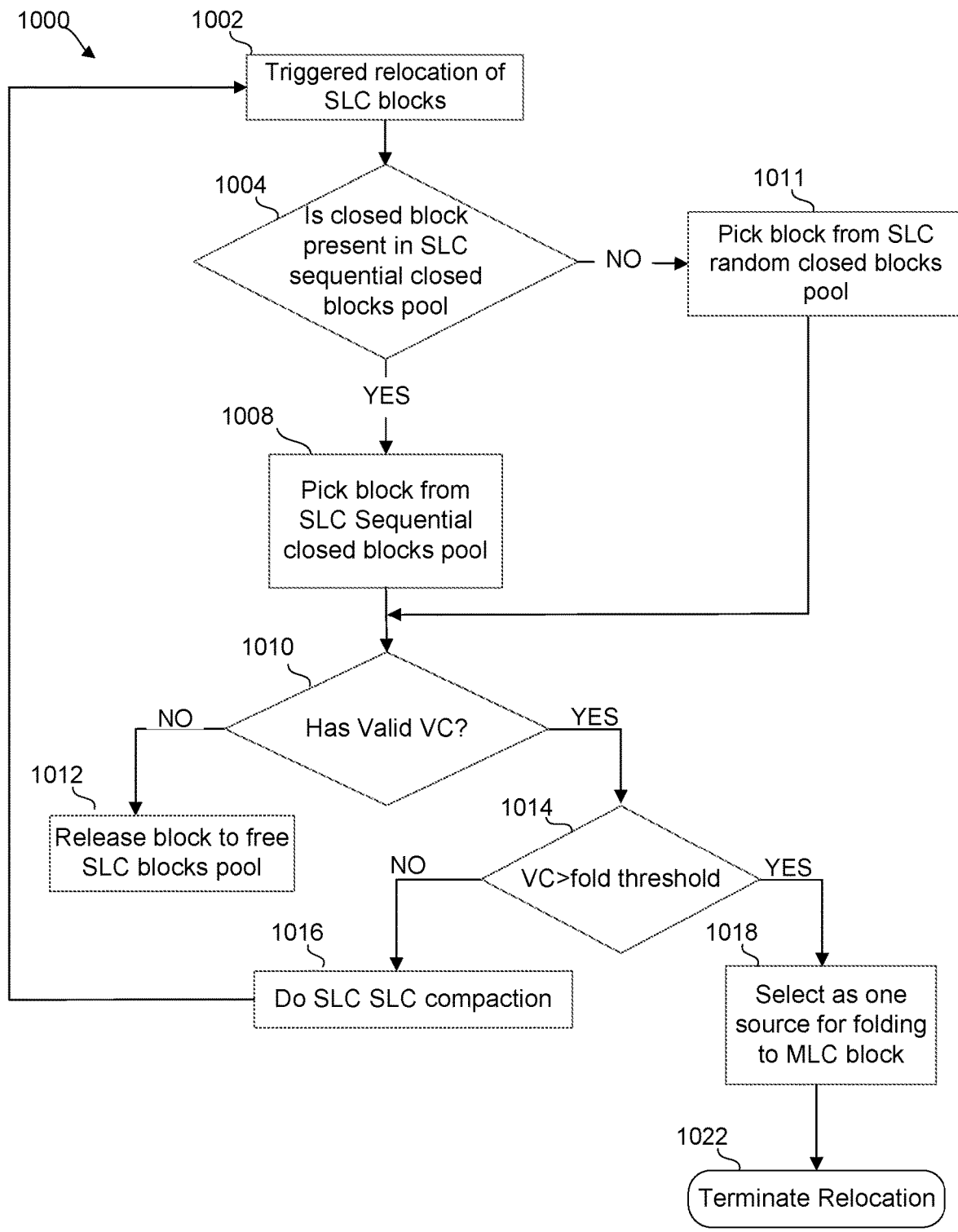
FIG. 10 is a flow diagram illustrating triggered relocation to MLC of sequential blocks while deferring relocation of random blocks.

FIG. 10 is a flow diagram illustrating triggered relocation of sequential blocks prior to the random blocks. When relocation is triggered, SLC data is moved to MLC based conventionally on LRC. In an embodiment, relocation is triggered first by whether the data in the block is sequential or random. Triggered relocation may commence at 1002 such as when there are no free blocks and the sequential and random SLC blocks closed pool are full. In some embodiments, relocation may be triggered by another criterion. The controller determines whether a closed block is present in the sequential SLC closed blocks pool (1004). This step (1004) allows the controller to confirm that a closed block still remains in the SLC sequential closed blocks pool, even after the process has been ongoing for some time and a number of prior sequential blocks have been relocated. If a full sequential block is present in the SLC sequential closed pool, the block is picked (1008). The block may be picked using some criterion in furtherance of a wear leveling algorithm; alternatively, the block may picked based on an LRC criterion. The controller determines whether the picked sequential block has a valid VC (1010), meaning whether the block includes valid data. If not (e.g., all data in the block is invalid), the block is then released to the free SLC blocks pool (1012). This step beneficially prevents any block with no valid data from being considered for folding into the MLC block. In addition, this step may allow the block returned to the free pool to receive valid data for storage.

If, however, the sequential block has a valid VC, then the controller may query whether the VC has met or exceeded a specified fold threshold (1014). Thus, according to an embodiment, the data does not undergo a blindfolded relocation. To the contrary, the block must have some specified threshold of valid data in order to be selected for relocation.

If the block does not meet the VC count, this may indicate that more data in the block is being invalidated. Thus instead of moving the valid data to an MLC block, the data can advantageously be moved to another SLC block via SLC-SLC compaction (1016). If the VC meets/exceeds the fold threshold, the data in the block is selected as one source for folding to an MLC block (1018). The folding may occur right at step 1018, or altogether at once in other embodiments along with the sequential data from each block that meets the threshold.

After SLC-SLC compaction (1016), control returns to the start (1002) to continue relocation of SLC blocks. After folding (1018), relocation is terminated (1022).

It is noted in FIG. 10 that upon triggering of a relocation event, the controller will always first determine at 1004 if a closed block is present in the sequential SLC closed pool. Only when there is no remaining data from the closed sequential blocks will the control pick a random block from the random SLC closed blocks pool and take the same actions of steps 1010, 1011, 1012, 1014, 1016, 1018, 1020 and 1022 to relocate the random blocks in the random SLC closed blocks pool to appropriate MLC portions, and thereby complete the process of relocating first the sequential data and only after the sequential data is complete, relocating the random data. At this point, the random and sequential data can be stored in blocks in the MLC portions of the storage device with the WA reduced considerably throughout the process, and with the SLC free to receive additional information for storage. It should be noted that 1014 requires the VC of the data to exceed some fold threshold, which may cause data from blocks that do not have enough valid data to remain in one of the SLC portions until a time when its VC increases to the threshold.

Figure 11:
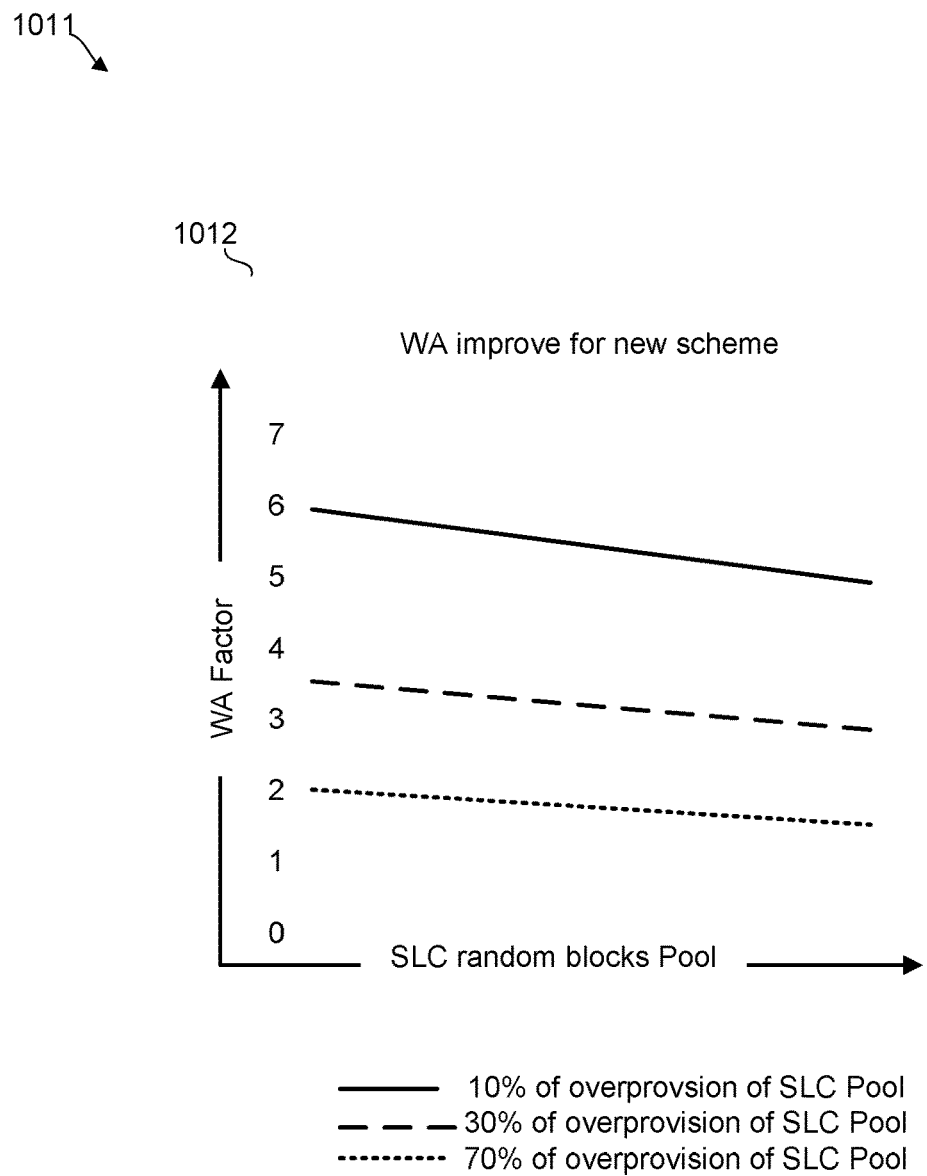
FIG. 11 is a plot of improved write amplification performance based on different amounts of over-provisioning of the SLC pool to random data.

FIG. 11 is a plot of improved write amplification performance based on different amounts of over-provisioning of the SLC pool to random data. The horizontal axis of the plot represents the size of the SLC random blocks pool. The vertical axis of the plot is the WA factor. The WA factor is equal to one (1) at a given time only if there is one copy of data in the storage device corresponding to one host write of the data. The graph of data in FIG. 11 demonstrates that WA performance improves as more of the SLC random blocks pool is allocated to random data.

An objective of the disclosed embodiments is to hold random data for a longer duration in the SLC pool. The more the SLC provision that can be allocated for random data, the more random data that can be held in the SLC pool. This in turn can reduce relocation of invalid data to the MLC and improve WA. It is noted that ordinarily, a designer cannot simply allocate an arbitrary size of the SLC overprovision pool to random data for its own sake, as the allocation also depends on unrelated factors like the host data pattern and the anticipated storage requirements. In summary, optimal allocation of SLC blocks for the random pool as described gives the best results of the least amount of WA, and the allocation can be decided based on the application and host behavior, FIG. 11 shows three curves that correspond, from upper to lower, to 10% overprovisioning of the SLC pool, 30% overprovisioning of the SLC pool, and 70% overprovisioning of the SLC pool. Overprovisioning is the process of including additional storage capacity, here in the SLC pool, for a solid state drive. Overprovisioning of the SLC pool allocated to random data can reduce unwanted relocation of invalid data to the MLC block, which in turn reduces both WA and random read latencies. This increased performance due to the overprovisioning of the SLC pool for the random data confirms that, by deferring SLC-MLC relocation of random data, the controller can hold the random data for a longer duration in the SLC pool, which in turn can increase the amount of valid data that gets relocated to the MLC portions.

FIG. 11 demonstrates that (1) the more blocks in the SLC random blocks pool, the lower the WA factor, and (2) the WA factor progressively decreases as the percentage of overprovisioning of the SLC pool allocated to random data increases.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a memory comprising a single-level cell (SLC) portion and a multi-level cell (MLC) portion; and
   a controller configured to determine data as falling into one of two total categories, the two total categories being random data or sequential data, to allocate a first closed block pool for only the sequential data and a second closed block pool for only the random data, to relocate closed blocks of the sequential data in the SLC portion from the first closed block pool to the MLC portion, and to relocate the random data from the second closed block pool to the MLC portion, wherein the closed blocks of sequential data are relocated to the MLC portion upon a fold threshold being met prior to the closed blocks of random data being moved to the MLC portion, wherein data is random when its length is less than a specified threshold and at least three consecutive host write commands corresponding to the data fall within discontinuous logical block addresses, and the data is sequential otherwise.

2. The storage device of claim 1, wherein the controller is further configured to store data in the SLC portion as sequential or random data in respective first or second data blocks.

3. The storage device of claim 2, wherein the controller is further configured to close each of the first and second data blocks from further host writes when the block is determined to be full.

4. The storage device of claim 3, wherein the controller is further configured to move the full first or second data block to the corresponding first or second closed block pool.

5. The storage device of claim 1, wherein the controller is further configured to relocate data in the SLC portion from the second closed block pool after relocating data in other regions of the SLC portion from the first closed block pool.

6. The storage device of claim 1, wherein the controller is configured to identify received data corresponding to a specified number of consecutive sectors included within three or more write instructions as sequential data.

7. The storage device of claim 6, wherein the controller is further configured to identify received data corresponding to a value from one sector up to a maximum number of sectors that can concurrently be received in a single host write instruction as random data.

8. The storage device of claim 1, wherein the controller is configured to release the first and second closed block pools to a single open pool for subsequent writes after completing relocation of the data from both the first and second closed block pools.

9. A storage device, comprising:
a memory comprising single-level cell (SLC) and multi-level cell (MLC) portions; and
a controller configured to:
determine data as falling into one of two total categories, the two total categories being random data or sequential data,
write the random data only to a random data block in the SLC portion and write the sequential data only to a sequential data block in the SLC portion, and
relocate the sequential data in the sequential data blocks to the MLC portions prior to relocating the random data in the random data blocks to the MLC portions, wherein data is random when its length is less than a specified threshold and at least three consecutive host write commands corresponding to the data fall within discontinuous logical block addresses, and the data is sequential otherwise.

10. The storage device of claim 9, wherein the controller is further configured to allocate, when one of the random or sequential data blocks is determined to be full, the random or sequential data block to a corresponding random or sequential closed block pool.

11. The storage device of claim 10, wherein the controller is further configured to relocate the sequential data in each of the sequential data blocks to the MLC portion upon determining that an amount of valid data in the block meets a threshold.

12. The storage device of claim 11, wherein the controller is further configured to release the sequential and random closed blocks pools to a single open pool for subsequent host writes to the memory after completing relocation of the data in the sequential and random data blocks.

13. The storage device of claim 9, wherein the controller is further configured to identify sequential data as data corresponding to a specified plurality of continuous logical addresses received with a plurality of host write instructions.

14. The storage device of claim 9, wherein the controller is further configured to identify random data as data corresponding to one or more consecutive logical addresses received in a single host write instruction.

15. The storage device of claim 9, wherein data included with at least N consecutive host write requests having continuous logical addresses comprises sequential data, and otherwise the data comprises random data, wherein N is a positive integer greater than one (1).

16. A storage device, comprising:
a memory comprising a plurality of SLC memory locations and a plurality of MLC memory locations; and
a controller configured to determine data as falling into one of two total categories, the categories being random data or sequential data, to write the random data to one of the SLC memory locations and the sequential data to another of the SLC memory locations, and upon determining that an amount of valid data in the another of the SLC memory locations meets a threshold, to relocate the sequential data to the plurality of MLC memory locations, wherein the sequential data is relocated prior to initiating relocation of the random data, wherein data is random when its length is less than a specified threshold and at least three consecutive host write commands corresponding to the data fall within discontinuous logical block addresses, and the data is sequential otherwise.

17. The storage device of claim 16, wherein the SLC memory locations comprise a free blocks pool partitioned into a plurality of blocks available for storing data included with a plurality of host writes, each block comprising different SLC memory locations of the plurality of SLC memory locations, and each block is allocated for use in storing only random data or only sequential data.

18. The storage device of claim 17, wherein the controller is further configured to close each of the blocks from further writes upon determining that the block is full, and to allocate the closed block to a random pool if the block comprises random data or to a sequential pool if the block comprises sequential data.

19. The storage device of claim 18, wherein the controller is further configured to release the random and sequential pools to a single pool for writes after all of the blocks comprising valid data are relocated.

20. The storage device of claim 18, wherein the controller is further configured to relocate the random data to another of the plurality of MLC memory locations upon determining that:
a size of the free blocks pool, or a number of blocks available for writes in the free blocks pool, is at or below a threshold;
all blocks in the sequential pool comprising valid data have been moved; and
no blocks remain in the sequential pool.

* * * * *